US007572743B2

(12) United States Patent \
Rinzler et al.

(10) Patent No.: US 7,572,743 B2 \
(45) Date of Patent: Aug. 11, 2009

(54) LOW TEMPERATURE METHODS FOR FORMING PATTERNED ELECTRICALLY CONDUCTIVE THIN FILMS AND PATTERNED ARTICLES THEREFROM

(75) Inventors: Andrew Gabriel Rinzler, Newberry, FL (US); Zhuangchun Wu, Gainesville, FL (US)

(73) Assignee: University of Florida Research Foundation, Inc., Gainesville, FL (US)

( * ) Notice: Subject to any disclaimer, the term of this patent is extended or adjusted under 35 U.S.C. 154(b) by 310 days.

(21) Appl. No.: 11/525,067

(22) Filed: Sep. 21, 2006

(65) Prior Publication Data

US 2007/0065977 A1 Mar. 22, 2007

Related U.S. Application Data

(60) Provisional application No. 60/719,256, filed on Sep. 21, 2005.

(51) Int. Cl. \
*H01L 21/00* (2006.01)

(52) U.S. Cl. .................. 438/800; 438/962; 977/892; 977/893; 257/E51.04

(58) Field of Classification Search ........... 438/800, 438/962; 977/892, 893 \
See application file for complete search history.

(56) References Cited

U.S. PATENT DOCUMENTS 6,232,706 B1 5/2001 Dai et al. \
6,831,017 B1 12/2004 Li et al.

(Continued)

FOREIGN PATENT DOCUMENTS

JP 2003/288835 10/2003

(Continued)

OTHER PUBLICATIONS

Fan et al., Self-Oriented Regular Arrays of Carbon Nanotubes and their Field Emission Properties, Science, Jan. 22, 1999, vol. 283, pp. 512-514.

(Continued)

*Primary Examiner*—Zandra Smith \
*Assistant Examiner*—Christy L Novacek \
(74) *Attorney, Agent, or Firm*—Saliwanchik, Lloyd & Saliwanchik

(57) ABSTRACT

A method of forming patterned thin films includes the steps of providing a porous membrane and a solution including a plurality of solid constituents and at least one surface stabilizing agent for preventing the solid constituents from flocculating out of suspension. The solution is dispensed onto a surface of the membrane. The solution is then removed by filtration through the membrane, wherein a patterned film coated membrane comprising a plurality of primarily spaced apart patterned regions are formed on the membrane. In one embodiment the method further includes the step of blocking liquid passage through selected portions of the membrane to form a plurality of open membrane portions and a plurality of blocked membrane portions before the dispensing step. The dispensing step includes ink jet printing the solution. An article having a patterned nanotube-including film thereon includes a substrate, and a patterned nanotube including film disposed on the substrate. The film includes a plurality of primarily spaced apart patterned regions, wherein nanotubes in the film are preferentially aligned parallel to a long direction of the patterned regions. The preferential alignment is generally most pronounced towards an edge of the patterned regions.

9 Claims, 2 Drawing Sheets

U.S. PATENT DOCUMENTS

2005/0199894 A1* 9/2005 Rinzler et al. .................. 257/94
2005/0202578 A1* 9/2005 Yaniv et al. .................... 438/20

FOREIGN PATENT DOCUMENTS

| WO | WO 2004/009884 | 1/2004 |
|---|---|---|
| WO | WO 2005/083751 | 9/2005 |
| WO | WO 2007/004758 | 1/2007 |

OTHER PUBLICATIONS

Huang et al., "Growth of aligned SWNT arrays from water-soluble molecular cluster for nanotube device fabrication," Phys. Chem. Chem. Phys., 2004, vol. 6, 1077-1079.

Web-page, "New ink-jet technology for the formation of ultra fine dots . . . ," available at http://www.aist.go.jp/alst_e/new_research/20020401/20020401.html.

* cited by examiner

LOW TEMPERATURE METHODS FOR FORMING PATTERNED ELECTRICALLY CONDUCTIVE THIN FILMS AND PATTERNED ARTICLES THEREFROM

CROSS-REFERENCE TO RELATED APPLICATIONS

This application claims the benefit of U.S. Provisional Patent Application Ser. No. 60/719,256, entitled "LOW TEMPERATURE METHODS FOR FORMING PATTERNED ELECTRICALLY CONDUCTIVE THIN FILMS" filed on Sep. 21, 2005, the entirety of which is incorporated herein by reference.

STATEMENT REGARDING FEDERALLY SPONSORED RESEARCH OR DEVELOPMENT

Not applicable.

FIELD OF THE INVENTION

This invention relates to low temperature methods of producing patterned electrically conductive thin films, which can also be optically transparent, and articles including such patterned layers.

BACKGROUND

There exist numerous applications for substantially optically transparent, electrically conducting films. Published U.S. Application No. 20040197546 ('546) to Rinzler et al., one of the present inventors, is entitled "Transparent electrodes from single wall carbon nanotubes". '546 discloses a low temperature method of forming substantially optically transparent and electrically conductive single wall nanotube (SWNT) films.

'546 discloses uniformly suspending SWNTs in solution generally aided by a stabilizing agent (e.g. surfactant) followed by the deposition of the nanotubes onto the surface of a porous filtration membrane that possesses a high density of pores that are too small for the majority of the SWNTs to pass through. The nanotube film forms as an interconnected and uniform layer having the SWNTs generally lying on and being parallel to the membrane surface as the liquid is filtered away.

In one embodiment, the solution is vacuum filtered off, with the remaining SWNT film formed on the filter membrane surface. Any remaining surface stabilizing agent can be subsequently washed away and the film can then be allowed to dry. Significantly, the washing away of the stabilizing agents used to suspend the nanotubes permits the nanotubes to achieve intimate contact with each other (consolidated) throughout the body of the SWNT film. The nanotube film formed in this manner has one side intimately attached to the filtration membrane while the other side is uncoated. To make use of the film, it is generally necessary for the film be transferred to the desired substrate and to remove the membrane. This is accomplished by first adhering the free side of the nanotube film to the clean, desired substrate e.g. by pressure, followed by dissolution of the filtration membrane in a solvent in which the membrane is soluble.

The membrane material thus should be carefully selected. The membrane should tolerate the liquid in which the nanotubes are originally suspended, however the membrane should be soluble in a solvent to be removed that, ideally, does not chemically react with the substrate to which the SWNT film is to be attached. Dissolution of the membrane in this solvent leaves the nanotube film attached to the surface of the substrate. The '546 process can be extended to the deposition of materials other than nanotubes so long as 1) the material constituents can be uniformly suspended in a solution, 2) the liquid does not react with the selected filtration membrane material but passes through it, 3) the material constituents are retained on the membrane surface in the form of a film, and 4) the filtration membrane can be dissolved in solvent that does not dissolve the desired film, or the substrate, to which the film is to be transferred. For example, this method can thus also fabricate nanoparticle and nanowire thin films.

SUMMARY

A method of forming patterned thin films comprises the steps of providing a porous membrane and a solution comprising a plurality of solid constituents and at least one surface stabilizing agent for preventing the solid constituents from flocculating out of suspension. The solution is dispensed onto a surface of the membrane. The solution is then removed by filtration through the membrane, wherein a patterned film coated membrane comprising a plurality of primarily spaced apart patterned regions are formed on the membrane. In one embodiment the method further comprises the step of blocking liquid passage through selected portions of the membrane to form a plurality of open membrane portions and a plurality of blocked membrane portions before the dispensing step. In another embodiment of the invention, the dispensing step comprises ink jet printing the solution.

The solid constituents can comprises nanowires such as single walled carbon nanotubes (SWNT). In a preferred embodiment of the invention the surface stabilizing agent is a surfactant, the method further comprising the step of rinsing the patterned film with a solvent for removing surfactant remaining on said SWNT after said filtration step, wherein after the rinsing step the SWNTs come into intimate contact with one another. The solid constituents can comprise >99% by weight of single walled carbon nanotubes (SWNT).

The method can further comprise the step of placing the patterned film coated membrane on a surface to be processed, and then selectively dissolving the porous membrane to leave the patterned film on the surface to be processed. The surface to be processed can comprises a variety of solid surfaces, including a semiconductor surface. The patterned regions can comprise plurality of interpenetrated SWNTs, wherein in the patterned regions for a thickness of 100 nm, a sheet resistance of less than 100 ohm/sq and at least 30% optical transmission throughout a wavelength range from 0.4 to 5 µm is provided.

An article having a patterned nanotube-comprising film thereon comprises a substrate, and a patterned nanotube comprising film disposed on the substrate. The film comprises a plurality of primarily spaced apart patterned regions, wherein nanotubes in the film are preferentially aligned parallel to a long direction of the patterned regions. The preferential alignment is generally most pronounced towards an edge of the patterned regions.

The substrate can comprise a semiconductor. The patterned regions can provide for a thickness of 100 nm a room temperature sheet resistance of less than 100 ohm/sq, as well as at least 30% optical transmission throughout a wavelength range from 0.4 to 5 µm. The patterned regions can be >99% by weight single walled carbon nanotubes (SWNTs).

BRIEF DESCRIPTION OF THE DRAWINGS

A fuller understanding of the present invention and the features and benefits thereof will be accomplished upon review of the following detailed description together with the accompanying drawings, in which.

DETAILED DESCRIPTION

Figure 1:
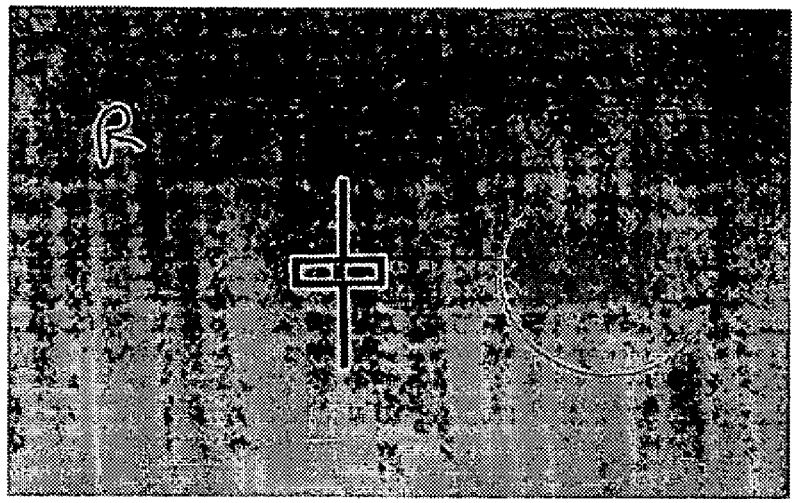
FIG. 1 shows an inverse pattern on a transparency sheet (left) prior to transfer to the membrane and the membrane (right) to which the pattern will be transferred. The pattern results in two adjacent nanotube sheets possessing interdigitated electrodes. The interdigitated pattern, too small to be visible in this image, lies within the black rectangle. For scale, the membrane is 25 mm in diameter.

A method of forming patterned thin films includes the steps of providing a porous membrane and a solution including a plurality of solid constituents and at least one surface stabilizing agent for preventing the solid constituents from flocculating out of suspension. The solution is dispensed onto a surface of the membrane. The solution is then removed by filtration through the membrane, wherein a patterned film coated membrane comprising a plurality of primarily spaced apart patterned regions are formed on the membrane.

In a first embodiment of the invention, a low temperature (e.g. room temperature) process for producing micron scale feature size patterns from surfactant suspended nanoscale constituents using a direct write ink-jet/filtration process is described. The ink comprises nanotubes (or other suitable materials) in aqueous suspension, with the aid of a stabilizing agent (e.g. a surfactant). The ink is placed in the reservoir of an ink-jet printer or similar dispensing device. Ink jet printers use a technology referred to as non-impact printing. The aqueous suspension is compatible with both thermal and piezo-electric, continuous or drop on demand (DOD), inkjet printing. For those surfactants possessing a cloud point at low temperatures, piezoelectric droplet formation may be preferable. For the purpose of writing the pattern, the ink droplets are printed in the normal fashion of inkjet printing except that the substrate onto which the pattern is written is preferably a porous filtration membrane, such as the same type as described in '546.

A typical filtration membrane is a mixed-cellulose ester (MCE) membrane possessing pores of the order of 100 nm (e.g. Millipore VCWP). This filtration membrane serves at least three (3) functions. Firstly, because of its high porosity (and its wetting by water) the liquid portion of the ink will absorb into the body of the membrane leaving the solids (e.g. nanotubes) to form a thin layer on the surface of the membrane in the desired pattern of written, physically connected dots. Secondly, once the pattern has been written, the filtration membrane can be placed in a vacuum or pressure filtration apparatus and the solids in the droplets washed by passing the appropriate solvent for removing the stabilizing agent through the solids and the membrane. Washing away the stabilizing agent allows the film solids, such as the nanotubes, to acquire direct intimate contact with each other, thus consolidating the patterned film. If the solid particles are electrically conducting (or can be made so), this intimate contact provides electrical continuity through the patterned solids and mechanical integrity, by virtue of contact forces between the solid constituents. Finally, the patterned, consolidated film can be transferred to the desired substrate by applying the free side of the film to the substrate (via pressure) after which the filtration membrane is dissolved away by a solvent in which the membrane is soluble, such as acetone for MCE membranes.

A typical inkjet DOD droplet size is 20 pico-liters, which has a diameter of ~34 µm. In order to form a 34 µm disk of nanotubes having a thickness (if taken to be uniform) of 20 nm requires $\sim 7.1 \times 10^{-9}$ mg of nanotubes. The nanotube concentration in the ink required to obtain such a thickness is ~0.35 mg/ml. This concentration may easily be achieved with a variety of surfactants (see e.g. W. Wenseleers et al. Advanced Functional Materials, Vol. 14, p. 1105 (2004)). Droplets as small as 1 pico-liter have been reported indicating the possibility of dot sizes (translating to written feature sizes) approaching 13 µm. Smaller drop sizes will also result in a thinner deposited film thickness unless the concentration of the solids is increased (or multiple drops are overlaid).

Because inkjet drops are generally very small, when nanotubes are used, a high concentration of nanotubes must be suspended in the ink. This requires that the suspension needs to be very good, otherwise flocculated nanotubes will block the very small inkjet orifice. This in turn requires a high surfactant concentration making it quite important that the surfactant be removed during a subsequent washing step. Otherwise the surfactant will prevent the obtainment of the desired high electrical conductivity of the patterned film.

As noted above, deposition systems other than ink-jet based systems can be used with the invention since the core of the present invention generally relates to the ability to wash away the surfactant because a pattern has been written on a membrane, generally followed by transfer of the patterned nanotube film to another substrate. For example, the nanotube suspension can also be deposited on the membrane using a device such as a plotter pen, that simply leaves a trace of the liquid in the pattern plotted.

Another exemplary deposition system type that can be used with the invention are systems based on directed ultrasonic vibrations to dispense fluid, disclosed in a paper by Larson et al. (B. J. Larson, S. D. Gillmor, and M. G. Lagally. *Controlled deposition of picoliter amounts of fluid using an ultrasonically driven micropipette*. Review of Scientific Instruments 75, 832-836 (2004). Such devices such as provided by SonoPlot LLC, Madison, Wis. The pumping action is highly controllable, and when coupled with a dispenser having a very sharp tip, can lead to the production of picoliter droplets of fluid. These droplets, when dispensed onto a surface, result in spots as small as 1 micron across.

In a second embodiment of the invention, a low temperature process for producing micron scale feature size patterns in films via a filtration process using membrane blocking is described. This process is based on the process disclosed in '546 noted in the Background, except prior to the film formation process, selected regions of the porous filtration membrane are blocked, so that the selected regions do not provide flow through porosity for the solution. During filtration nanotubes will not accumulate on the selected regions of the membrane, except for porous regions immediately adjacent to blocked regions.

For both embodiments of the invention the SWNT films formed are generally highly interconnected within the discrete regions. In addition, for both embodiments the film comprises SWNTs generally lying on and being parallel to the membrane surface.

The fabrication of films having the desired pattern can be achieved by blocking or disrupting the porosity of the filtration membrane in a pattern that is the inverse of the pattern desired in the ultimate film. The porosity of the membrane can, for example, be disrupted locally by filling the pores of the membrane with a substance that is insoluble in the liquid within which the nanotubes are suspended (during the film formation process), but which during, or after, dissolution of the membrane can be dissolved or destroyed by chemical attack, without affecting the nanotubes or the substrate to which the patterned nanotube film has been transferred.

Micron scale features may be obtained by forming the inverse pattern in a thermoplastic polymer or wax layer on a suitable substrate by photolithography, followed by transfer to the membrane as above. Alternatively, a polymer stamp, having the inverse pattern may be fabricated, and the pore blocking medium can be transferred to the membrane by stamping the pattern. The pore blocking medium could be a wax, requiring heat for the transfer or it could be a UV cured epoxy resin. Such contact printing can yield sub-micron feature sizes. The porosity of the membrane will wick a fluid into its body expanding the transferred line widths in the membrane pattern. For a desired feature size in the ultimate nanotube film, this must be taken into account by careful control of the amount of pore blocking medium transferred to the membrane.

The longest linear dimension of the constituents to be filtered in forming the films sets a limit on the finest spacing between features that can be produced. For example, suppose that adjacent lines are desired, with spacing between the lines of 2 microns. The membrane must have a blocked region of 2 micron width between porous lines on either side. However, if a significant fraction of the nanotube bundles in suspension are 5 microns long, there is appreciable probability that during the filtration such a bundle will lie across the blocked region with its ends sucked down to the clear regions on either side. If electrical isolation between the lines is required this bundle will constitute an electrical short. Finer constituents will permit finer feature size films.

SWNT films according to the invention can include at least one dopant. For example, the dopant can be selected from the group consisting of halogens and alkali metals.

For the fabrication simplicity and lack of need for high temperature processing the invention is likely to provide the best transparent electrodes for making electrical contact to a wide variety of devices. For example, optically transparent and electrically conductive single walled carbon nanotubes (SWNT) films according to the invention can provide a sheet resistance of less than 200 ohm/sq for films 100 nm thick and also provide at least 30% optical transmission through a wavelength range of 0.4 to 5 µm.

Compositions and articles formed therefrom having unique structural aspects are obtainable using the invention. With regard to the first method embodiment described above relating to the blocked pores method, the hydrodynamic forces during filtration processing that sweep the nanotubes away from the regions where the pores are blocked to the regions where the pores are not blocked also tends to preferentially align the nanotubes to lie parallel to the line demarking the blocked from the unblocked regions of the membrane or other porous support. Since in many cases the purpose of the patterning is to define electrodes, this means that the nanotubes in the electrodes (or other structures) produced acquire a measure of alignment parallel to the long direction of the electrode (especially towards the edge of the electrode). Since aligned nanotubes are known to have enhanced electrical conductivity along the direction of the alignment and the inventive process described enhances the alignment along the electrode long direction, the electrode conductivity is enhanced along the direction that it is most needed. In contrast, alternative methods for forming patterned nanotube films, such as standard photo- or e-beam lithography and etching of nanotube films, do not provide preferential alignment along the long directions of defined electrodes.

High electrical conductivity together with high optical transparency can be provided for devices having one or more materials not able to withstand high temperature processing, such as >200 C. Products expected to benefit from the invention include transparent thin film transistor or transparent electrode patterning for display devices, such as laptop monitors, patterned photoresistors, and patterned electro-optic devices.

EXAMPLES

It should be understood that the Example described below is provided for illustrative purposes only and does not in any way define the scope of the invention.

In a proof of principle experiment, the inverse of a desired pattern was first printed using a solid ink printer (Xerox Phaser 8400) onto a transparency sheet (Phaser 840/850 Standard Transparency Film) as shown in FIG. 1. A transparency sheet is preferred over paper because it provides a more uniform substrate to accept the thermoplastic ink than paper. The filtration membrane used (Millipore, VCWP) was then placed onto a vacuum filtration base (having a flat porous frit) with the transparency sheet placed, print side down, onto the porous membrane. The vacuum was started, pulling the transparency sheet into intimate contact with the membrane. To transfer the ink from the transparency sheet to the membrane heat was applied sufficient to melt or attain the softening point of the thermoplastic ink, at which point it was sucked into the pores of the membrane. A convenient method for applying such heat is to place the filtration reservoir on top of the transparency film, as would be the case for normal filtration, followed by filling the reservoir with water heated to the melting temperature of the copolymer ink. The non-porous transparency film does not permit the water to pass.

Figure 2:
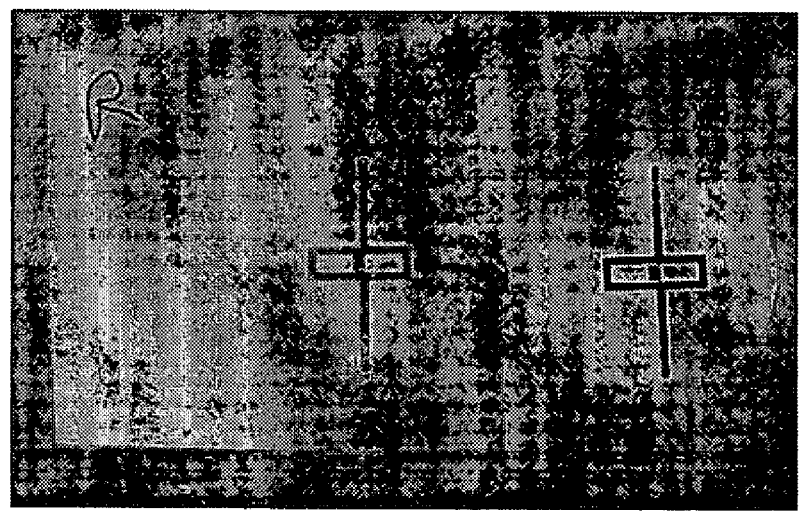
FIG. 2 shows the inverse pattern transferred to the membrane.

Following this step the water and filtration reservoir were removed and the transparency film was peeled off the membrane. The ink, which re-solidified upon cooling, permeated the surface pores of the membrane, now blocking the pores in a replica of the pattern printed on the transparency film (FIG. 2) to provide a membrane having a plurality of open membrane portions and a plurality of blocked membrane portions.

Figure 3:
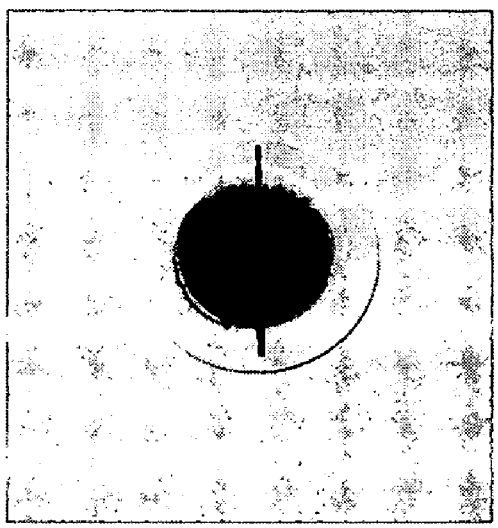
FIG. 3 shows the nanotube film deposited on the membrane. Right: micrograph of the central interdigitated portion of the film. No nanotubes are seen to be deposited in the black regions. For scale on the right the nanotubes finger widths are ~100 microns. Measurement of the electrical resistance between the interdigitated nanotube films on the membrane showed no electrical contact between the two sides.
Figure 3:
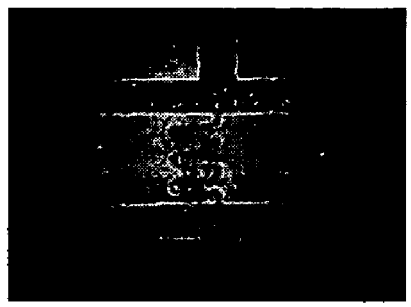
Figure 4:
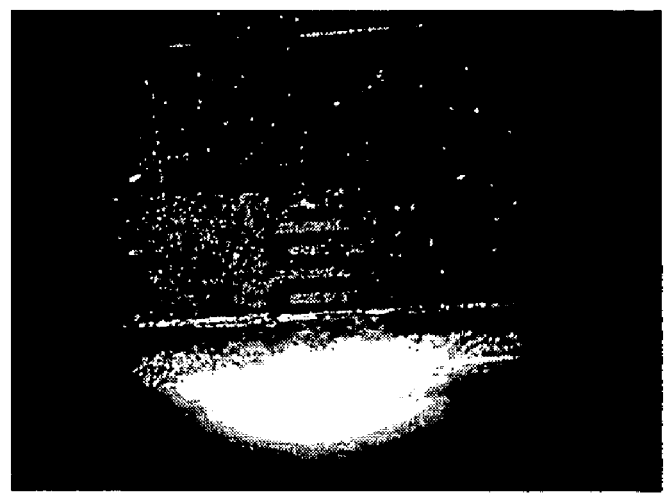
FIG. 4 shows a zoomed in view of the interdigitated portion of the nanotube films. For scale, the fingers are ~100 microns wide. The scratch running through the bottom electrode occurred post fabrication.

The filtration reservoir was then replaced and a nanotube suspension filtered using the membrane having a plurality of open membrane portions and a plurality of blocked membrane portions as described above for nanotube film formation (FIG. 3). The nanotube layer only formed on the membrane in a pattern defined by the plurality of open membrane portions. The patterned film was then wetted with water and laid onto a substrate, nanotube film side against the substrate (in this case a GaAs (semiconductor) wafer). The substrate and membrane were then sandwiched between absorbent paper layers between two flat metal plates and pressure applied by spring clamps. Once the membrane was virtually dried (accelerated by heating to 80° C. in an oven), the substrate and membrane were exposed to condensing acetone vapors in an acetone vapor bath (the substrate situated on a cooled condenser in the bath). The condensing acetone dissolved the membrane washing it from the substrate, leaving the nanotube film behind on the substrate (nanotubes are not soluble in acetone). Upon such transfer of the patterned film to the desired substrate, the thermoplastic ink in the pores of the membrane was also transferred. If this ink is deleterious to the device function it can be dissolved away with a suitable solvent. FIG. 4 shows a zoomed in view of the interdigitated portion of the nanotube films. For scale, the fingers are ~100 microns wide. The scratch running through the bottom electrode occurred post fabrication.

It is to be understood that while the invention has been described in conjunction with the preferred specific embodiments thereof, that the foregoing description as well as the examples which follow are intended to illustrate and not limit the scope of the invention. Other aspects, advantages and modifications within the scope of the invention will be apparent to those skilled in the art to which the invention pertains.

We claim:

1. A method of forming patterned thin films, comprising the steps of:
    providing a porous membrane and a solution comprising a plurality of solid constituents and at least one surface stabilizing agent for preventing said solid constituents from flocculating out of suspensions;
    dispensing said solution onto a surface of said porous membrane; and
    removing said solution and said surface stabilizing agent by filtration through said membrane, wherein a patterned film coated membrane comprising a plurality of primarily spaced apart patterned regions on said membrane is formed, wherein said pattern regions have direct intimate contact between said solid constituents.

2. The method of claim 1, further comprising the step of blocking liquid passage through selected portions of said membrane to form a plurality of open membrane portions and a plurality of blocked membrane portions before said dispensing step.

3. The method of claim 1, wherein said dispensing step comprises ink jet printing said solution.

4. The method of claim 1, wherein said solid constituents comprise single walled carbon nanotubes (SWNT).

5. The method of claim 4, wherein said surface stabilizing agent is a surfactant, further comprising the step of rinsing said patterned film with a solvent for removing surfactant remaining on said SWNTs after said filtration step, wherein after said rinsing step said SWNTs come into intimate contact with one another.

6. The method of claim 4, wherein said solid constituents comprise >99% by weight said single walled carbon nanotubes (SWNTs).

7. The method of claim 1, further comprising the step of placing said patterned film coated membrane on a surface to be processed, and then selectively dissolving said porous membrane to leave said patterned film on said surface to be processed.

8. The method of claim 7, wherein said surface to be processed comprises a semiconductor surface.

9. The method of claim 1, wherein said patterned regions comprise plurality of interpenetrated SWNTs, said patterned regions for a thickness of 100 nm provides a sheet resistance of less than 100 ohm/sq and at least 30% optical transmission throughout a wavelength range from 0.4 to 5 µm.

* * * * *